United States Patent [19]

Huang

[11] Patent Number: 5,893,741
[45] Date of Patent: Apr. 13, 1999

[54] METHOD FOR SIMULTANEOUSLY FORMING LOCAL INTERCONNECT WITH SILICIDED ELEVATED SOURCE/DRAIN MOSFET'S

[75] Inventor: Tiao-yuan Huang, Hsinchu, Taiwan

[73] Assignee: National Science Council, Taipei, Taiwan, TWX

[21] Appl. No.: 08/797,745

[22] Filed: Feb. 7, 1997

[51] Int. Cl.$^6$ ............................................. H01L 21/336
[52] U.S. Cl. .................. 438/300; 438/649; 438/683; 117/9
[58] Field of Search ........................... 438/300, 301, 438/305, 649, 683; 117/9

[56] References Cited

U.S. PATENT DOCUMENTS

| | | |
|---|---|---|
| 4,948,745 | 8/1990 | Pfiester et al. |
| 5,079,180 | 1/1992 | Rodder et al. |
| 5,084,417 | 1/1992 | Joshi et al. |
| 5,118,639 | 6/1992 | Roth et al. |
| 5,198,378 | 3/1993 | Rodder et al. |
| 5,242,847 | 9/1993 | Ozturk et al. |
| 5,306,667 | 4/1994 | Shappir. |
| 5,496,750 | 3/1996 | Moslehi. |
| 5,504,031 | 4/1996 | Hsu et al. |
| 5,637,518 | 6/1997 | Prall et al. |

OTHER PUBLICATIONS

Kotaki et al., "Novel Elevated Silicide Source/Drain (ESSOD) by Load-Lock LPCVD-Si and Advanced Silicidation Processing", IEDM, pp. 34.3.1–34.3.4, 1993.

*Primary Examiner*—Richard A. Booth
*Attorney, Agent, or Firm*—Smith, Gambrell & Russell; Beveridge, DeGrandi, Weilacher & Young Intellectual Property Group

[57] ABSTRACT

A method for formation of both local innerconnection and silicidation of source/drain transistors using the deposition of a blanket silicon layer over the entire top surface of the transistors and selectively stripping of unwanted portions of the silicon layer is disclosed. The method includes the step of applying a photoresist mask to map out where the local interconnection and source/drain are to be located. The final recited step is to deposit a thin metal layer to provide for the silicidation to complete the transistor. The silicon layer that is deposited has a thickness of 20 to 300 millimeters, and the thin metal layer is either cobalt or titanium having a thickness of 10 millimeters to 100 millimeters.

7 Claims, 5 Drawing Sheets

METHOD FOR SIMULTANEOUSLY FORMING LOCAL INTERCONNECT WITH SILICIDED ELEVATED SOURCE/DRAIN MOSFET'S

UTILIZATION FIELD IN INDUSTRY

To prevent the degradation of the transistor's electrical property caused by parasitic resistors in the source/drain sector, silicidation of source/drain is commonly applied during the production of scaled micro-chip. Generally, such technology can be achieved by the silicidation of source/drain or self-aligned silicidation; among which, self-aligned silicidation can also accomplish the silicidation of gate. Consequently, silicidation of source/drain is widely used in the processing of scaled micro-chip. Nevertheless, the silicidation of gate not only can be achieved by self-aligned silicidation, the conventional multiple-layer gate of $WSi_2$ or TiN/Poly can also be applied.

Elevated source/drain transistor can deter short-channel effects efficiently, and the silicidation of transistor's source/drain can effectively reduce the inherent resistance of the source/drain to ensure the performance of transistor whereas local interconnection enhances the efficiency of circuit layout. Therefore, the ideal future technology for down-sizing micro-chip production depends on how to reduce the production process in accomplishing local interconnection and silicidated source/drain transistor.

BACKGROUND TECHNIQUE

In recent years, to deter the worsening of short-channel effects generated by greater chip down-sizing, C. Mazure, etc. and H. Kotaki, etc. proposed employing elevated source/drain chip structure in reducing the source/drain junction depth as a method in preventing short-channel effects, refer to 1992 IEDM, December Issue, pp. 853–856, and 1993 IEDM, December Issue, pp. 839–842 respectively. The most commonly reported method of forming elevated source/drain is selective epitaxial growth(SEG) in the exposed source/drain sector.

Local interconnection is an effective means in enhancing the efficiency of circuit layout which is commonly applied in SRAM; it can be used to connect the neighboring source/drain and gate to consolidate the SRAM layout in reducing the silicon real estate. As documented in 1987 IEEE Trans. Electron Devices, March Issue, Page 682 by T. Tang and etc., the most common local interconnection is achieved by using TiN, a byproduct in producing $TiSi_2$, for selective masking and etching. The advantage of this method is utilizing the existing TiN without any further deposition procedure except an additional micro-etching to achieve the required local interconnection. However, the drawback is that the resistance of TiN is 10 times higher than $TiSi_2$ and only suitable for $TiSi_2$ system; it cannot be applied in $CoSi_2$ as TiN is not a byproduct derived from producing cobalt.

SUMMARY OF THE INVENTION

In this invention, we have proposed a new method which would allow the formation of an local inter connect(LI) layer with a silicided elevated source/drain device structure. The new method can be applied to-both $TiSi_2$ and $CoSi_2$-silicidation schemes.

The key feature of the present invention is the deposition of a thin blanket (i.e., as opposed to the selective epitaxial growth, SEG) silicon layer after the gate definition. This thin silicon layer serves to form the elevated source/drain in the source/drain regions. In addition, this thin silicon layer can be patterned and defined, according to the desired LI connection. Then, a thin Ti or Co layer can be deposited and annealed (by thermal or RTA) to form a $TiSi_2$ or $CoSi_2$ layer. The unreacted Ti or Co can then be stripped, leaving the $TiSi_2$ or $CoSi_2$ only on top of the LI lines as well as the source/drain regions.

The core of this invention is a method of new and simple production procedure that achieve both local interconnection and the silicidation of elevated source/drain transistor at the same time. Furthermore, this invention can also be applied in the production of $TiSi_2$ and $CoSi_2$.

The essence of this invention lies in applying a thin blanket Si deposition, differentiated from the general selective formation, along with photoresist masking for selective etching in striping the unreacted Ti or Co. The remaining portions shall form the local interconnection and elevated source/drain after Ti or Co deposition followed by the silicidation. The local interconnection achieved by this invention provides not only simple production procedure, it also enjoys lower resistance compared to conventional $TiSi_2$ local interconnection. Additionally, this method can also be applied in the silicidation of $CoSi_2$.

REFERENCE NUMBER OF THE ATTACHED DRAWINGS

1. . . . poly-Si
2. . . . epi-Si
3. . . . silicided LI layer
4. . . . silicided S/D

DESCRIPTION OF THE INVENTION

This invention includes:

a) attuned with the conventional procedures in producing MOS and CMOS to achieve the photolithographic patterning and etching of gate as well as the layout of LDD ions and the formation of sidewall spacer;

b) form a thin blanket silicon layer; adjust the conditions of the deposition to form single crystal silicon on the exposed source/drain and poly crystal silicon on top of the oxidized layer or other poly crystals;

c) apply photolithographic procedure in laying out the $n^+$ and $p^+$ source/drain ions (placing in the n-type and p-type transistors separately);

d) followed by using a specially designed local interconnection photomask in selectively striping off the unwanted thin poly silicon crystal layer not protected by the photoresist, leaving the portions to be used for local interconnection and source/drain;

e) deposit a thin metal layer;

f) silicidation processing;

g) follow the remaining steps of the conventional production procedures until completion.

Figure 1:
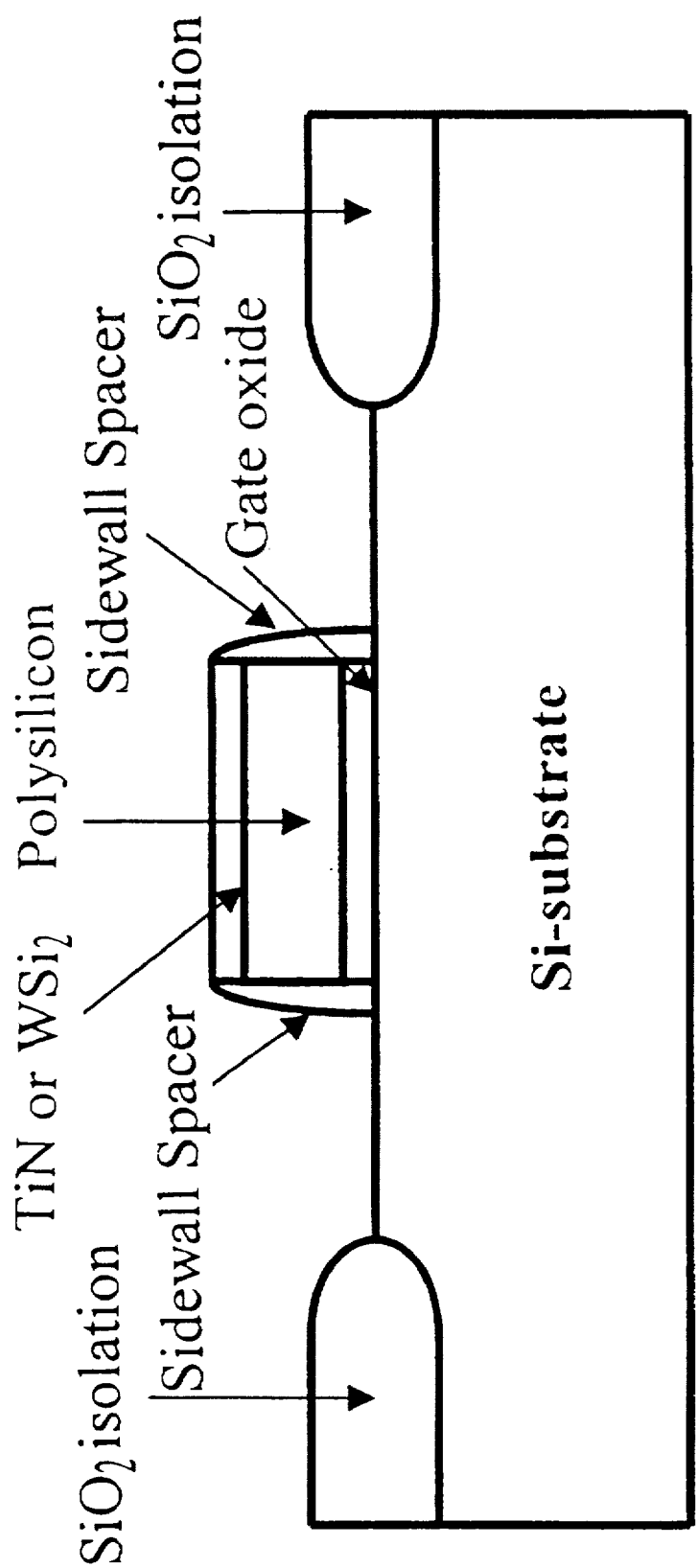
FIG. 1. Form a Gate
Figure 2:
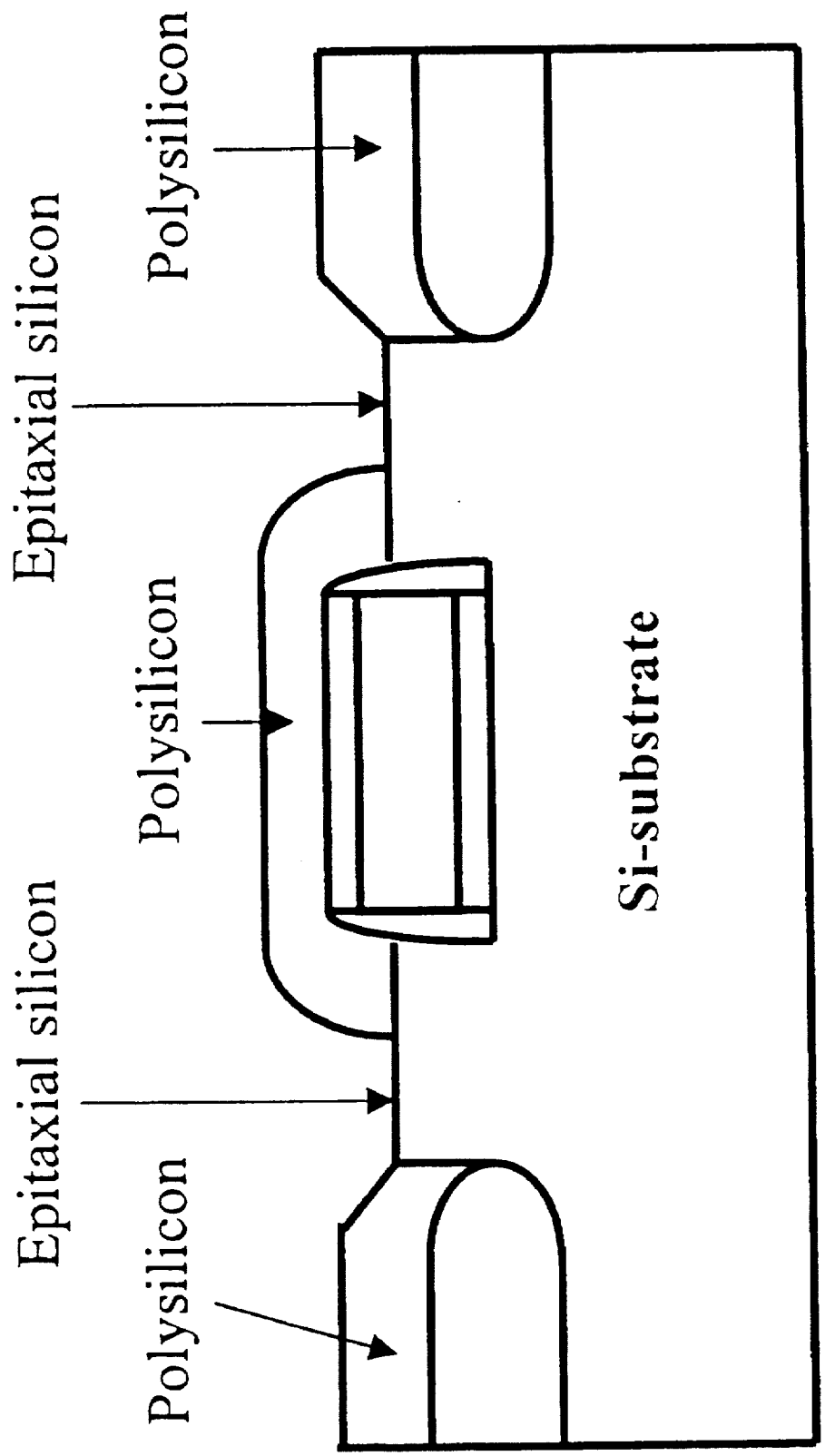
FIG. 2. Blanket Si deposition

Based on the feature of this invention, the new style of production procedure can be incorporated in the conventional CMOS production procedure in achieving the photolithographic patterning and etching of gate as well as the following step of LDD ion layout in forming the sidewall spacer as shown in FIG. 1. $WSi_2$/Poly and TiN/Poly can be applied to form gate layer in reducing the resistance of gate wire. The next step of forming a thin blanket silicide layer is another critical step of this invention. This step is different from the selective epitaxial growth(SEG) of conventional elevated source/drain formation. Such thin blanket silicide layer can utilize the load-lock LPCVD-Si method as proposed by H. Kotaki and etc., refer to 1993 IEDM, December Issue, pp. 839–842, which forms single crystal silicon on the exposed source/drain and poly crystal silicon on top of the oxidized layer or other poly crystal gates such as thick oxidized insulation layer, poly crystal gates, $WSi_2$/Poly or TiN/Poly as shown in FIG. 2. The thickness of the crystal silicide layer formed ranges from 20 nm to 300 nm.

Figure 3:
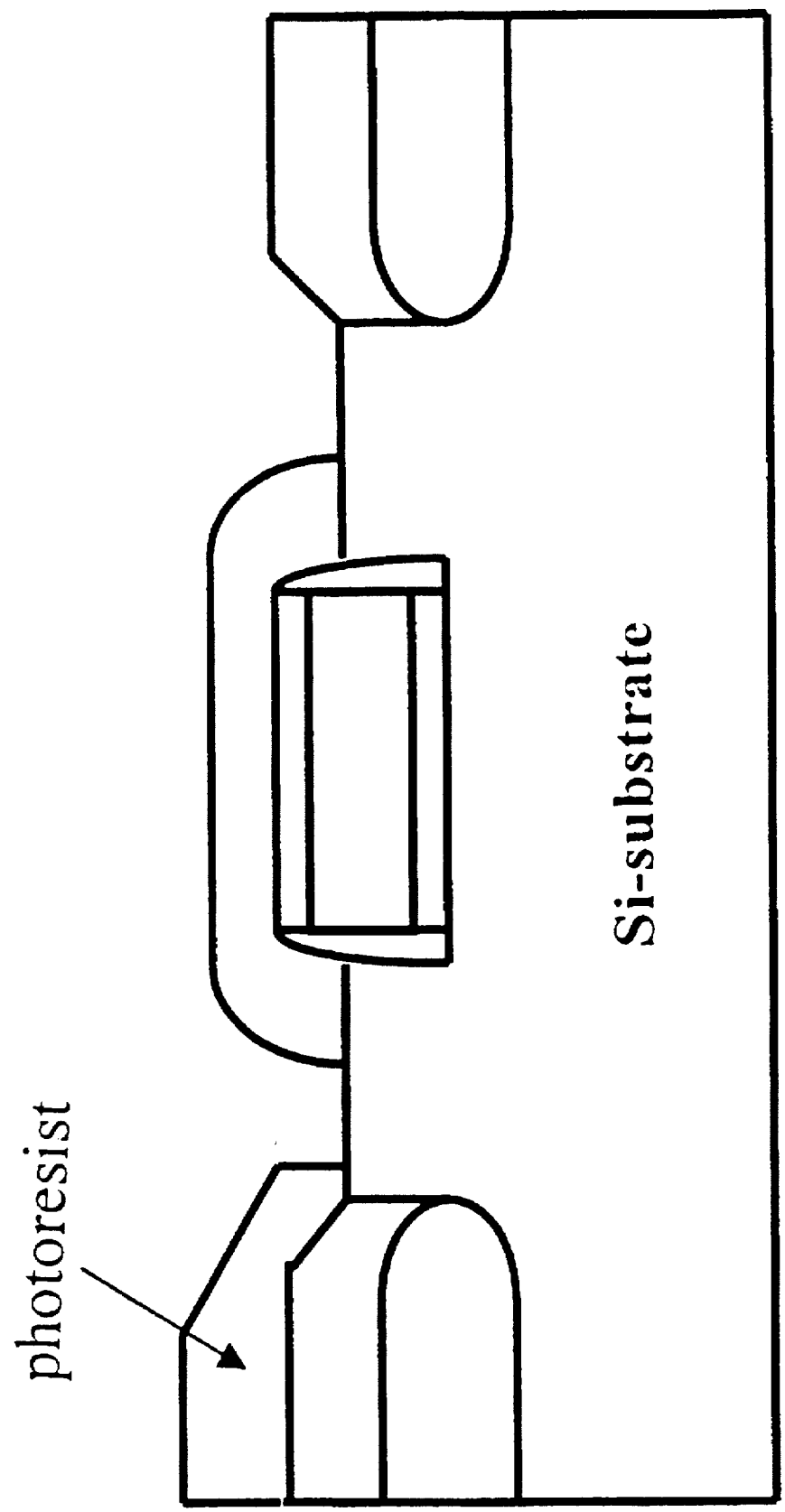
FIG. 3. Resist pattern by LI-mask
Figure 4:
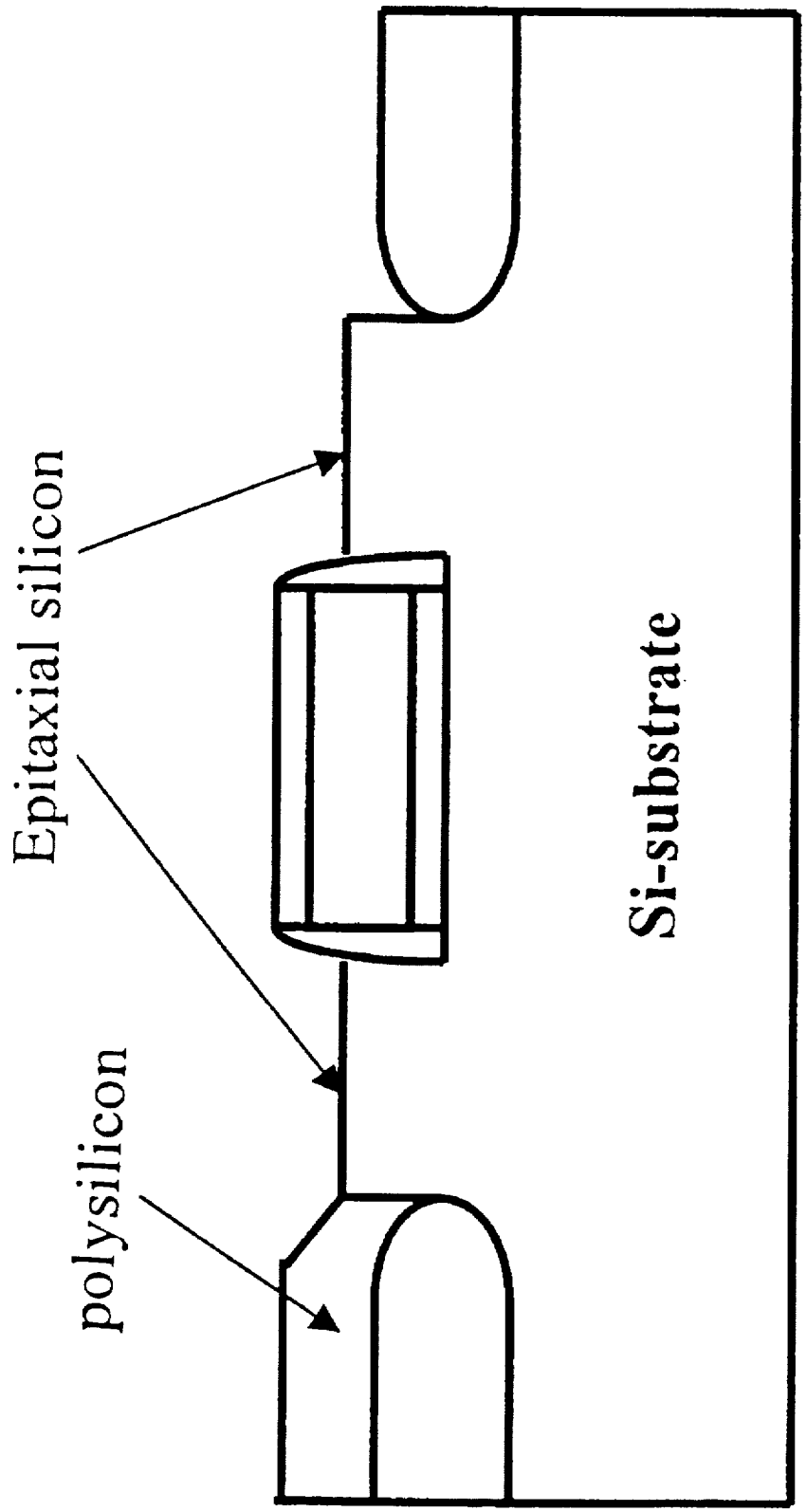
FIG. 4. Etching exposed Si and resist strip
Figure 5:
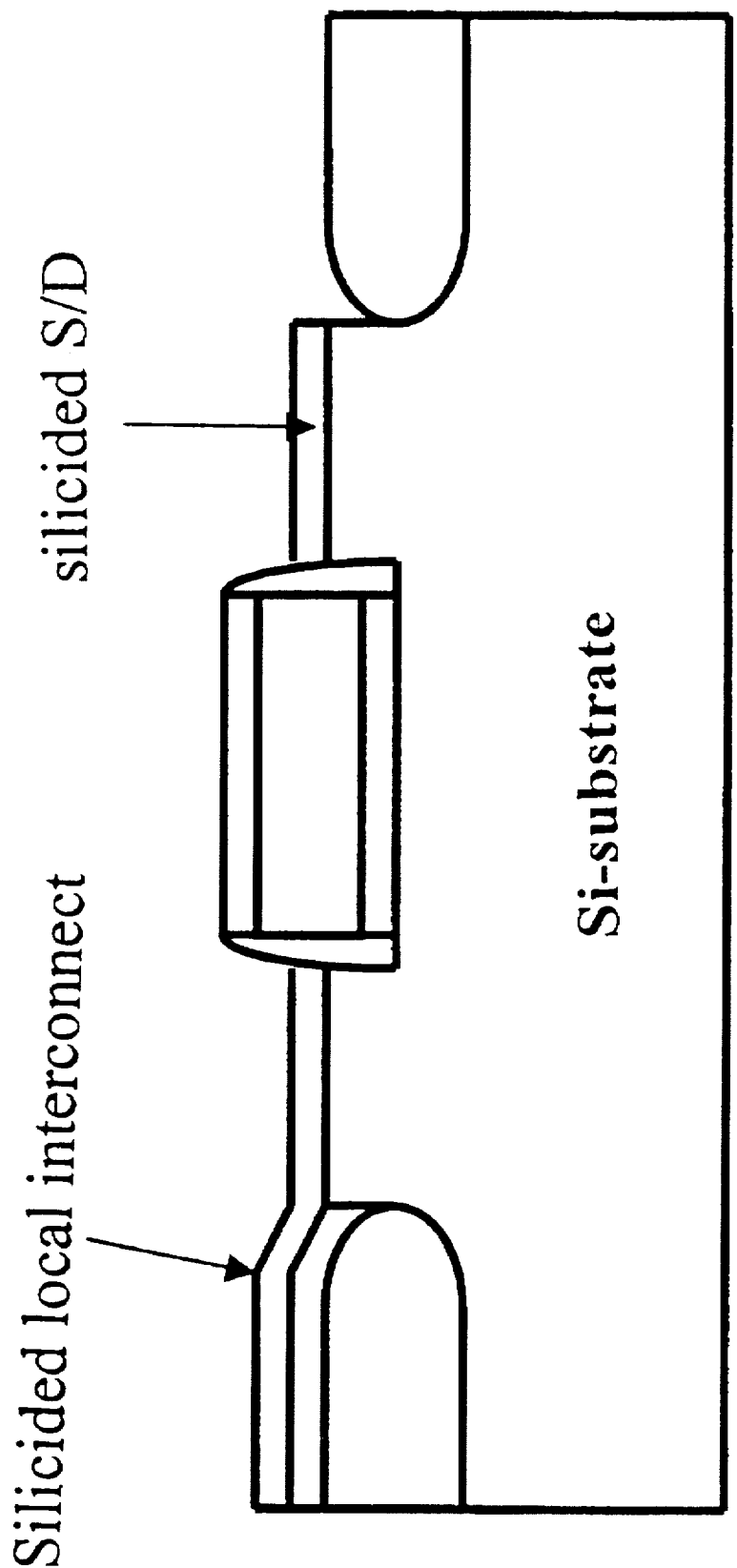
FIG. 5. After Ti or Co dep, RTA, and stripping of unreacted Ti or Co

Then, apply the photoresist masking step in n-type and p-type transistors for the ion-layout of $n^+$ and $p^+$ source/drain. The density and distribution energy are determined by what is required in covering the thin silicide layer formed on source/drain. The next step is to apply a specially designed local interconnect layer photomask to selectively strip off the unwanted thin silicide layer, leaving the portions required in the local interconnection and source/drain sector as shown in FIG. 4. This step is more easily achieved than the local interconnect (LI) photomask design as shown in FIG. 3 due to the great differential erosive rate of a $CH_3COOH$, $HNO_3$, and HF based solution on poly crystal silicon and single crystal silicon. Next, a thin layer of cobalt (or thin Ti layer) will be deposited on the wafer and proper silicidation shall ensue. Various rapid thermal anneal (RTA) methods can be applied to form desired $CoSi_2$ or $TiSi_2$ on the remaining thick silicide layer. The unreacted Co (or Ti) can be removed by suitable solvent, leaving the portions for the local interconnection and source/drain as shown in FIG. 5. The following procedures shall be the same as the conventional production procedures until completion. The thickness of the aforementioned deposited cobalt or Ti layer ranges from 10 nm to 100 nm.

A preferred embodiment of the current invention can follow a standard CMOS process flow up to the formation of sidewall spacers. To form a silicided gate region, the gate stack can, for example, be composed of a $WSi_2$/poly gate stack(or TiN/poly). Afterwards, a blanket thin silicon layer can be deposited. For example, a "load-lock LPCVD-Si" deposition system, as described in Ref. 2, can be applied to form epitaxial Si layer on the exposed source/drain regions; while forming polysilicon layers on the areas in contact with insulator(e.g., field oxide, as well as on top of the gate region, FIG. 2). Next, a photoresist layer can be applied and patterned, using the specifically designed LI-mask to protect the thin polysilicon layer where the LI is to be formed later (FIG. 3). This is followed by the selective removal of the exposed thin polysilicon layer. For example, a selective etching (i.e., between polysilicon and epitaxial silicon) technique, such as the use of $CH_3COOH+HNO_3+HF$ base solution, can be applied for this purpose. The use of a selective etching recipe would ease the layout of the LI-mask, as the exposed thin epitaxial silicon in the source/drain region would not be removed.

Next, a thin Ti or Co layer can be deposited, followed by RTA, to form the silicidation. The unreacted Ti or Co on top of the insulator as well as on the exposed gate can then be removed, leaving the silicided source/drain and the silicided LI layer (i.e., the LI layer can be used to connect one source/drain region to the other source/drain region. It can also be used to connect a source/drain region to a gate region) The rest of the process can follow a standard backend process to completion.

To summarize the above description, the new production procedure of this invention provides the following advantages:

1. Novelty: This is the first method of non-selective thin silicon growth layer which achieves both local interconnection and silicidation of elevated source/drain at the same time.
2. Diversity: This invention not only can accomplish the functions described above under Item 1, New Style, it also enjoys lower electric resistance compared to conventional TiN/Poly-local interconnection and can also be applied in the silicidation of $CoSi_2$.
3. Practicality: This invention can be immediately applied to the production of integrated circuits which is capable of enhancing the electric performance of transistors as well as the efficiency of product layout in increasing the productivity.

What is claimed is:

1. A method to provide both local interconnection and silicidation of source/drain transistors comprising the steps of:

photolithographic patterning and etching to form a gate structure, forming a sidewall spacer around the gate structure, forming a blanket silicon layer in which single crystal silicon is disposed on an exposed source/drain and polycrystal silicon is disposed on top of an oxidized layer, said gate structure, and side wall spacer, applying a photoresist mask in implanting $n^+$ and $p^+$ source/drain ions to form a LDD region, selectively stripping off unwanted portions of the silicon layer not protected by photoresist in a local interconnection photomask, wherein the remaining portions are used for local interconnection and source/drain, and depositing a metal layer in which a silicide layer is formed on said polycrystal silicon to form a local interconnection and a silicide is formed on said single crystal silicon of said source/drain to form a silicided source/drain.

2. The method according to claim 1, wherein said blanket silicon layer is grown in a load-lock LPCVD-Si, and said blanket silicon layer has a thickness of 20 nm to 300 nm.

3. The method according to claims 1, wherein the step of selectively stripping is by a $CH_3COOH$, $HNO_3$, and HF based solution.

4. The method according to claim 1, wherein the deposited thin metal layer is cobalt having a thickness of 10 nm to 100 nm.

5. The method according to claim 1, wherein the deposited thin metal layer is titanium having a thickness of 10 nm to 100 nm.

6. The method according to claim 1, wherein an uppermost portion of said gate structure is $WSi_2$/Poly.

7. The method according to claim 1, wherein an uppermost portion of said gate structure is TiN/Poly.

* * * * *